(12) United States Patent
Plesski et al.

(10) Patent No.: US 11,909,381 B2
(45) Date of Patent: Feb. 20, 2024

(54) TRANSVERSELY-EXCITED FILM BULK ACOUSTIC RESONATORS WITH TWO-LAYER ELECTRODES HAVING A NARROWER TOP LAYER

(71) Applicant: MURATA MANUFACTURING CO., LTD, Kyoto (JP)

(72) Inventors: Viktor Plesski, Gorgier (CH); Patrick Turner, San Bruno, CA (US); Robert Hammond, Santa Barbara, CA (US); Bryant Garcia, Burlingame, CA (US); Ventsislav Yantchev, Sofia (BG); Neal Fenzi, Santa Barbara, CA (US); Julius Koskela, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 626 days.

(21) Appl. No.: 17/133,498

(22) Filed: Dec. 23, 2020

(65) Prior Publication Data
US 2021/0126622 A1 Apr. 29, 2021

Related U.S. Application Data

(63) Continuation-in-part of application No. 16/944,831, filed on Jul. 31, 2020, now Pat. No. 11,114,996,
(Continued)

(51) Int. Cl.
*H03H 9/54* (2006.01)
*H03H 9/13* (2006.01)
(Continued)

(52) U.S. Cl.
CPC .............. *H03H 9/547* (2013.01); *H03H 3/04* (2013.01); *H03H 9/02228* (2013.01); *H03H 9/02559* (2013.01); *H03H 9/132* (2013.01)

(58) Field of Classification Search
CPC .. H03H 9/02228; H03H 3/04; H03H 9/02031; H03H 9/132; H03H 9/174;
(Continued)

(56) References Cited

U.S. PATENT DOCUMENTS 5,446,330 A 8/1995 Eda et al.
5,552,655 A 9/1996 Stokes et al.
(Continued)

FOREIGN PATENT DOCUMENTS

CN 113765495 A 12/2021
JP H10209804 A 8/1998
(Continued)

OTHER PUBLICATIONS

Assila, N. et. al. "A1 Mode Lamb Wave on Thin LiTaO3 for High Frequency Acoustic Devices", Proceedings of the 11th IEEE Annual International Conference on Nano/Micro Engineered and Molecular Systems (NEMS) Matsushima Bay and Sendai MEMS City, Japan, Apr. 17-20, 2016 (Year: 2016).*
(Continued)

*Primary Examiner* — Hafizur Rahman
(74) *Attorney, Agent, or Firm* — ARENTFOX SCHIFF LLP

(57) ABSTRACT

An acoustic resonator device, filter devices, and methods of making the same. An acoustic resonator device includes a substrate having a surface and a single-crystal piezoelectric plate having front and back surfaces, where the back surface is attached to the surface of the substrate except for a portion of the piezoelectric plate forming a diaphragm that spans a cavity in the substrate. The device further includes an interdigital transducer formed on the front surface of the piezoelectric plate, where interleaved fingers of the IDT disposed on the diaphragm are configured such that a radio frequency signal applied to the IDT excites a primary shear
(Continued)

acoustic mode in the diaphragm. The interleaved fingers include a first layer adjacent the diaphragm and a second layer over the first layer, the second layer having a narrower width than the first layer.

28 Claims, 13 Drawing Sheets

Related U.S. Application Data which is a continuation of application No. 16/779,255, filed on Jan. 31, 2020, now Pat. No. 10,826,462, which is a continuation-in-part of application No. 16/578,811, filed on Sep. 23, 2019, now Pat. No. 10,637,438, which is a continuation-in-part of application No. 16/230,443, filed on Dec. 21, 2018, now Pat. No. 10,491,192.

(60) Provisional application No. 63/094,796, filed on Oct. 21, 2020, provisional application No. 63/019,759, filed on May 4, 2020, provisional application No. 62/926,181, filed on Oct. 25, 2019, provisional application No. 62/685,825, filed on Jun. 15, 2018, provisional application No. 62/701,363, filed on Jul. 20, 2018, provisional application No. 62/741,702, filed on Oct. 5, 2018, provisional application No. 62/748,883, filed on Oct. 22, 2018, provisional application No. 62/753,815, filed on Oct. 31, 2018.

(51) Int. Cl.
*H03H 9/02* (2006.01)
*H03H 3/04* (2006.01)

(58) Field of Classification Search
CPC ........ H03H 9/176; H03H 9/562; H03H 9/564; H03H 9/568; H03H 2003/023; H03H 2003/0442
USPC ........................................ 333/186, 187, 189
See application file for complete search history.

(56) References Cited

U.S. PATENT DOCUMENTS

| | | | |
|---|---|---|---|
| 5,726,610 A | 3/1998 | Allen et al. | |
| 5,853,601 A | 12/1998 | Krishaswamy et al. | |
| 6,377,140 B1 | 4/2002 | Ehara et al. | |
| 6,516,503 B1 | 2/2003 | Ikada et al. | |
| 6,540,827 B1 | 4/2003 | Levy et al. | |
| 6,707,229 B1 | 3/2004 | Martin | |
| 6,710,514 B2 | 3/2004 | Ikada et al. | |
| 6,833,774 B2 | 12/2004 | Abbott et al. | |
| 7,345,400 B2 | 3/2008 | Nakao et al. | |
| 7,423,365 B2* | 9/2008 | Tsutsumi | H03H 9/14541 310/313 R |
| 7,463,118 B2 | 12/2008 | Jacobsen | |
| 7,535,152 B2 | 5/2009 | Ogami et al. | |
| 7,684,109 B2 | 3/2010 | Godshalk et al. | |
| 7,728,483 B2 | 6/2010 | Tanaka | |
| 7,868,519 B2 | 1/2011 | Umeda | |
| 7,939,987 B1 | 5/2011 | Solal et al. | |
| 7,941,103 B2 | 5/2011 | Iwamoto et al. | |
| 8,278,802 B1 | 10/2012 | Lee et al. | |
| 8,294,330 B1 | 10/2012 | Abbott et al. | |
| 8,344,815 B2 | 1/2013 | Yamanaka | |
| 8,816,567 B2 | 8/2014 | Zuo et al. | |
| 8,829,766 B2 | 9/2014 | Milyutin et al. | |
| 8,932,686 B2 | 1/2015 | Hayakawa et al. | |
| 9,093,979 B2 | 7/2015 | Wang | |
| 9,112,134 B2 | 8/2015 | Takahashi | |
| 9,130,145 B2 | 9/2015 | Martin et al. | |
| 9,219,466 B2 | 12/2015 | Meltaus et al. | |
| 9,240,768 B2 | 1/2016 | Nishihara et al. | |
| 9,276,557 B1 | 3/2016 | Nordquist et al. | |
| 9,369,105 B1 | 6/2016 | Li | |
| 9,425,765 B2 | 8/2016 | Rinaldi | |
| 9,525,398 B1 | 12/2016 | Olsson | |
| 9,640,750 B2 | 5/2017 | Nakanishi et al. | |
| 9,748,923 B2 | 8/2017 | Kando et al. | |
| 9,762,202 B2 | 9/2017 | Thalmayr et al. | |
| 9,780,759 B2 | 10/2017 | Kimura et al. | |
| 9,837,984 B2 | 12/2017 | Khlat et al. | |
| 9,923,539 B2* | 3/2018 | Matsuda | H03H 3/08 |
| 10,079,414 B2 | 9/2018 | Guyette et al. | |
| 10,187,039 B2 | 1/2019 | Komatsu et al. | |
| 10,200,013 B2 | 2/2019 | Bower et al. | |
| 10,211,806 B2 | 2/2019 | Bhattacharjee | |
| 10,284,176 B1 | 5/2019 | Solal | |
| 10,491,192 B1 | 11/2019 | Plesski et al. | |
| 10,601,392 B2 | 3/2020 | Plesski et al. | |
| 10,637,438 B2 | 4/2020 | Garcia et al. | |
| 10,644,674 B2 | 5/2020 | Takamine | |
| 10,756,697 B2 | 8/2020 | Plesski et al. | |
| 10,790,802 B2 | 9/2020 | Yantchev et al. | |
| 10,797,675 B2 | 10/2020 | Plesski | |
| 10,819,309 B1 | 10/2020 | Turner et al. | |
| 10,826,462 B2 | 11/2020 | Plesski et al. | |
| 10,868,510 B2 | 12/2020 | Yantchev | |
| 10,868,512 B2 | 12/2020 | Garcia et al. | |
| 10,917,070 B2 | 2/2021 | Plesski et al. | |
| 10,985,728 B2 | 4/2021 | Plesski et al. | |
| 11,108,375 B2* | 8/2021 | Iwaki | H03H 9/02897 |
| 11,146,232 B2 | 10/2021 | Yandrapalli et al. | |
| 11,201,601 B2 | 12/2021 | Yantchev et al. | |
| 11,394,364 B2* | 7/2022 | Matsuda | H03H 9/175 |
| 2002/0079986 A1 | 6/2002 | Ruby et al. | |
| 2002/0158714 A1 | 10/2002 | Kaitila et al. | |
| 2002/0189062 A1 | 12/2002 | Lin et al. | |
| 2003/0080831 A1 | 5/2003 | Naumenko et al. | |
| 2003/0199105 A1 | 10/2003 | Kub et al. | |
| 2004/0041046 A1 | 3/2004 | Imai et al. | |
| 2004/0100164 A1 | 5/2004 | Murata | |
| 2004/0207033 A1 | 10/2004 | Koshido | |
| 2004/0207485 A1 | 10/2004 | Kawachi et al. | |
| 2004/0261250 A1 | 12/2004 | Kadota et al. | |
| 2005/0099091 A1 | 5/2005 | Mishima et al. | |
| 2005/0185026 A1 | 8/2005 | Noguchi et al. | |
| 2005/0218488 A1 | 10/2005 | Matsuo | |
| 2005/0264136 A1 | 12/2005 | Tsutsumi et al. | |
| 2006/0131731 A1 | 6/2006 | Sato | |
| 2006/0179642 A1 | 8/2006 | Kawamura | |
| 2007/0090898 A1 | 4/2007 | Kando | |
| 2007/0115079 A1 | 5/2007 | Kubo et al. | |
| 2007/0182510 A1 | 8/2007 | Park | |
| 2007/0188047 A1 | 8/2007 | Tanaka | |
| 2007/0194863 A1 | 8/2007 | Shibata et al. | |
| 2007/0267942 A1 | 11/2007 | Matsumoto et al. | |
| 2007/0296304 A1 | 12/2007 | Fujii et al. | |
| 2008/0246559 A1 | 10/2008 | Ayazi | |
| 2010/0064492 A1 | 3/2010 | Tanaka | |
| 2010/0123367 A1 | 5/2010 | Tai et al. | |
| 2010/0212127 A1 | 8/2010 | Heinze et al. | |
| 2010/0223999 A1 | 9/2010 | Onoe | |
| 2010/0301703 A1 | 12/2010 | Chen et al. | |
| 2011/0018389 A1 | 1/2011 | Fukano et al. | |
| 2011/0018654 A1 | 1/2011 | Bradley et al. | |
| 2011/0102107 A1 | 5/2011 | Onzuka | |
| 2011/0109196 A1 | 5/2011 | Goto | |
| 2011/0278993 A1 | 11/2011 | Iwamoto | |
| 2012/0023719 A1* | 2/2012 | Huang | H10N 30/074 29/25.35 |
| 2012/0286900 A1 | 11/2012 | Kadota et al. | |
| 2013/0057360 A1 | 3/2013 | Meltaus et al. | |
| 2013/0207747 A1 | 8/2013 | Nishii et al. | |
| 2013/0234805 A1 | 9/2013 | Takahashi | |
| 2013/0271238 A1 | 10/2013 | Onda | |
| 2013/0278609 A1 | 10/2013 | Stephanou et al. | |
| 2013/0321100 A1 | 12/2013 | Wang | |
| 2014/0009032 A1 | 1/2014 | Takahashi et al. | |
| 2014/0113571 A1 | 4/2014 | Fujiwara et al. | |
| 2014/0130319 A1 | 5/2014 | Iwamoto | |

(56) References Cited

U.S. PATENT DOCUMENTS

| | | | |
|---|---|---|---|
| 2014/0145556 A1 | 5/2014 | Kadota | |
| 2014/0151151 A1 | 6/2014 | Reinhardt | |
| 2014/0152145 A1 | 6/2014 | Kando et al. | |
| 2014/0173862 A1 | 6/2014 | Kando et al. | |
| 2014/0225684 A1 | 8/2014 | Kando et al. | |
| 2014/0312994 A1 | 10/2014 | Meltaus et al. | |
| 2015/0042417 A1 | 2/2015 | Onodera et al. | |
| 2015/0244149 A1 | 8/2015 | Van Someren | |
| 2015/0319537 A1 | 11/2015 | Perois et al. | |
| 2015/0333730 A1 | 11/2015 | Meltaus | |
| 2016/0028367 A1 | 1/2016 | Shealy | |
| 2016/0049920 A1 | 2/2016 | Kishino | |
| 2016/0079958 A1 | 3/2016 | Burak | |
| 2016/0149554 A1 | 5/2016 | Nakagawa | |
| 2016/0182009 A1 | 6/2016 | Bhattacharjee | |
| 2017/0063332 A1 | 3/2017 | Gilbert et al. | |
| 2017/0155373 A1* | 6/2017 | Ruby | H03H 9/02574 |
| 2017/0179928 A1 | 6/2017 | Raihn et al. | |
| 2017/0187352 A1 | 6/2017 | Omura | |
| 2017/0201232 A1 | 7/2017 | Nakamura et al. | |
| 2017/0214381 A1 | 7/2017 | Bhattacharjee | |
| 2017/0214387 A1 | 7/2017 | Burak et al. | |
| 2017/0214389 A1 | 7/2017 | Tsutsumi | |
| 2017/0222617 A1 | 8/2017 | Mizoguchi | |
| 2017/0222622 A1 | 8/2017 | Solal et al. | |
| 2017/0264266 A1 | 9/2017 | Kishimoto | |
| 2017/0290160 A1 | 10/2017 | Takano et al. | |
| 2017/0359050 A1 | 12/2017 | Irieda et al. | |
| 2017/0370791 A1 | 12/2017 | Nakamura et al. | |
| 2018/0005950 A1 | 1/2018 | Watanabe | |
| 2018/0013400 A1 | 1/2018 | Ito et al. | |
| 2018/0013405 A1 | 1/2018 | Takata | |
| 2018/0026603 A1 | 1/2018 | Iwamoto | |
| 2018/0033952 A1 | 2/2018 | Yamamoto | |
| 2018/0062615 A1 | 3/2018 | Kato et al. | |
| 2018/0062617 A1 | 3/2018 | Yun et al. | |
| 2018/0123016 A1 | 5/2018 | Gong et al. | |
| 2018/0152169 A1 | 5/2018 | Goto et al. | |
| 2018/0191322 A1 | 7/2018 | Chang et al. | |
| 2018/0212589 A1 | 7/2018 | Meltaus et al. | |
| 2018/0316333 A1 | 11/2018 | Nakamura et al. | |
| 2018/0358948 A1 | 12/2018 | Gong et al. | |
| 2019/0007022 A1 | 1/2019 | Goto et al. | |
| 2019/0068155 A1 | 2/2019 | Kimura et al. | |
| 2019/0068164 A1 | 2/2019 | Houlden et al. | |
| 2019/0097604 A1* | 3/2019 | Saji | H03H 9/25 |
| 2019/0123721 A1 | 4/2019 | Takamine | |
| 2019/0131953 A1 | 5/2019 | Gong | |
| 2019/0181833 A1 | 6/2019 | Nosaka | |
| 2019/0207583 A1 | 7/2019 | Miura et al. | |
| 2019/0245518 A1 | 8/2019 | Ito | |
| 2019/0273480 A1 | 9/2019 | Lin | |
| 2019/0348966 A1 | 11/2019 | Campanella-Pineda | |
| 2020/0021272 A1 | 1/2020 | Segovia Fernandez et al. | |
| 2020/0036357 A1 | 1/2020 | Mimura | |
| 2020/0235719 A1 | 7/2020 | Yantchev et al. | |
| 2020/0295729 A1 | 9/2020 | Yantchev | |
| 2020/0304091 A1 | 9/2020 | Yantchev | |
| 2020/0321939 A1 | 10/2020 | Turner et al. | |
| 2020/0328728 A1 | 10/2020 | Nakagawa et al. | |
| 2020/0373907 A1 | 11/2020 | Garcia | |
| 2021/0273631 A1 | 9/2021 | Jachowski et al. | |
| 2021/0313951 A1 | 10/2021 | Yandrapalli et al. | |
| 2021/0328575 A1 | 10/2021 | Hammond et al. | |
| 2022/0103160 A1 | 3/2022 | Jachowski et al. | |
| 2022/0116015 A1 | 4/2022 | Garcia et al. | |
| 2022/0123720 A1 | 4/2022 | Garcia et al. | |
| 2022/0123723 A1 | 4/2022 | Garcia et al. | |
| 2022/0149808 A1 | 5/2022 | Dyer et al. | |
| 2022/0149814 A1 | 5/2022 | Garcia et al. | |

FOREIGN PATENT DOCUMENTS

| | | | | |
|---|---|---|---|---|
| JP | 2000134059 A | * | 5/2000 | H03H 9/02543 |
| JP | 2001244785 A | | 9/2001 | |
| JP | 2002300003 A | | 10/2002 | |
| JP | 2003078389 A | | 3/2003 | |
| JP | 2004096677 A | | 3/2004 | |
| JP | 2004129222 A | | 4/2004 | |
| JP | 2004523179 A | | 7/2004 | |
| JP | 2004304622 A | | 10/2004 | |
| JP | 2006173557 A | | 6/2006 | |
| JP | 2007251910 A | | 9/2007 | |
| JP | 2007329584 A | | 12/2007 | |
| JP | 2010062816 A | | 3/2010 | |
| JP | 2010103803 A | | 5/2010 | |
| JP | 2010154505 A | | 7/2010 | |
| JP | 2010233210 A | | 10/2010 | |
| JP | 2013528996 A | | 7/2013 | |
| JP | 2013214954 A | | 10/2013 | |
| JP | 2015054986 A | | 3/2015 | |
| JP | 2016001923 A | | 1/2016 | |
| JP | 2017526254 A | | 9/2017 | |
| JP | 2017220910 A | | 12/2017 | |
| JP | 2018093487 A | | 6/2018 | |
| JP | 2018166259 A | | 10/2018 | |
| JP | 2018207144 A | | 12/2018 | |
| JP | 2019186655 A | | 10/2019 | |
| JP | 2020113939 A | | 7/2020 | |
| WO | 2010047114 A1 | | 4/2010 | |
| WO | 2013021948 A1 | | 2/2013 | |
| WO | 2015098694 A1 | | 7/2015 | |
| WO | 2016017104 | | 2/2016 | |
| WO | 2016052129 A1 | | 4/2016 | |
| WO | 2016147687 A1 | | 9/2016 | |
| WO | 2017188342 A1 | | 11/2017 | |
| WO | 2018003268 A1 | | 1/2018 | |
| WO | 2018003273 A1 | | 1/2018 | |
| WO | 2018163860 A1 | | 9/2018 | |
| WO | 2019117133 A1 | | 6/2019 | |
| WO | 2019138810 A1 | | 7/2019 | |
| WO | 2020092414 A2 | | 5/2020 | |
| WO | 2020100744 A1 | | 5/2020 | |

OTHER PUBLICATIONS

Gaydazhiev, D.G., "Acoustic Dispersion Analysis of the Resonant Modes in FBAR", Annual Journal of Electronics, 2015, ISSN 1314-0078, Sep. 2015. (Year: 2015).*

Buchanan "Ceramit Materials for Electronics" 3rd Edition, first published in 2004 by Marcel Dekker, Inc. pp. 496 (Year 2004). Jan. 2004.

Sorokin et al. "Study of Microwave Acoustic Attenuation in a Multi-frequency Bulk Acoustic Resonator Based on a Synthetic Diamond Single Crystal" Published in Acoustical Physics, vol. 61, No. 6, 2015 pp. 675 (Year 2015) Jan. 2015.

Zou, Jie "High-Performance Aluminum Nitride Lamb Wave Resonators for RF Front-End Technology" University of California, Berkeley, Summer 2015, pp. 63 (Year 2015) Jan. 2015.

Santosh, G. , Surface acoustic wave devices on silicon using patterned and thin film ZnO, Ph.D. thesis, Feb. 2016, Indian Institute of technology Guwahati, Assam, India Feb. 2016.

Merriam Webster, dictionary meaning of the word "diaphragm", since 1828, Merriam Webster (Year: 1828) 1828.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

USPTO/ISA, International Search Report and Written Opinion for PCT Application No. PCT/US2020/45654 dated Oct. 29, 2020. 2020.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

A. C. Guyette, "Theory and Design of Intrinsically Switched Multiplexers With Optimum Phase Linearity," in IEEE Transactions

(56) References Cited

OTHER PUBLICATIONS on Microwave Theory and Techniques, vol. 61, No. 9, pp. 3254-3264, Sep. 2013, doi: 10.1109/TMTT.2013.2274963. Sep. 2013.
Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.
Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.
T. Takai, H. Iwamoto, et al., "I.H.P.Saw Technology and its Application to Microacoustic Components (Invited). " 2017 IEEE International Ultrasonics Symposium, Sep. 6-9, 2017. pp. 1-8.
R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.
M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.
Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.
Y. Yang, A. Gao et al. "5 Ghz Lithium Niobate Mems Resonators With High FOM of 153", 2017 IEEE 30th International Conference in Micro Electro Mechanical Systems (MEMS). Jan. 22-26, 2017. pp. 942-945.
USPTO/ISA, International Search Report and Written Opinion for PCT Application No. PCT/US2019/036433 dated Aug. 29, 2019.
USPTO/ISA, International Search Report and Written Opinion for PCT Application No. PCT/US2019/058632 dated Jan. 17, 2020.
G. Manohar, "Investigation of Various Surface Acoustic Wave Design Configurations for Improved Sensitivity." Doctoral dissertation, University of South Florida, USA, Jan. 2012, 7 pages.
Ekeom, D. & Dubus, Bertrand & Volatier, A.. (2006). Solidly mounted resonator (SMR) FEM-BEM simulation. 1474-1477. 10.1109/ULTSYM.2006.371.
Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.
Naumenko et al., "Optimal orientations of Lithium Niobate for resonator SAW filters", 2003 IEEE Ultrasonics Symposium—pp. 2110-2113. (Year: 2003).
Webster Dictionary Meaning of "diaphragm" Merriam Webster since 1828.
Safari et al. "Piezoelectric for Transducer Applications" published by Elsevier Science Ltd., pp. 4 (Year: 2000).
Moussa et al. Review on Triggered Liposomal Drug Delivery with a Focus on Ultrasound 2015, Bentham Science Publishers, pp. 16 (Year 2005).
Acoustic Properties of Solids ONDA Corporation 592 Weddell Drive, Sunnyvale, CA 94089, Apr. 11, 2003, pp. 5 (Year 2003).
Bahreynl, B. Fabrication and Design of Resonant Microdevices Andrew William, Inc. 2018, NY (Year 2008).
Material Properties of Tibtech Innovations, © 2018 Tibtech Innovations (Year 2018).
Chen et al., "Development and Application of SAW Filter," Micromachines, Apr. 20, 2022, vol. 13, No. 656, pp. 1-15.
Hermann et al., "Properties of shear-horizontal surface acoustic waves in different layered quartz-SiO2 structures," Ultrasonics, 1999, vol. 37, pp. 335-341.
Lam et al., "A Review of Lame and Lamb Mode Crystal Resonators for Timing Applications and Prospects of Lame and Lamb Mode Piezo MEMS Resonators for Filtering Applications," 2018 International Symposium on Acoustic Wave Devices for Future Mobile Communication Systems, Mar. 6-7, 2018, 12 pages.

\* cited by examiner

TRANSVERSELY-EXCITED FILM BULK ACOUSTIC RESONATORS WITH TWO-LAYER ELECTRODES HAVING A NARROWER TOP LAYER

RELATED APPLICATION INFORMATION

This patent claims priority from the following provisional patent applications: application 63/094,796, filed Oct. 21, 2020, entitled XBAR ELECTRODES WITH PEDESTAL CROSS-SECTION, and application 63/019,759, filed May 4, 2020, entitled OPTIMIZED IDT ELECTRODE CROSS SECTION FOR XBAR TO REDUCE SPURS.

This patent is a continuation-in-part of application Ser. No. 16/944,831, filed Jul. 31, 2020, entitled TRANSVERSELY-EXCITED FILM BULK ACOUSTIC RESONATORS WITH MOLYBDENUM CONDUCTORS, which is a continuation of application Ser. No. 16/779,255, filed Jan. 31, 2020, entitled TRANSVERSELY-EXCITED FILM BULK ACOUSTIC RESONATORS WITH MOLYBDENUM CONDUCTORS, now U.S. Pat. No. 10,826,462, application Ser. No. 16/779,255 claims priority from provisional patent application 62/926,181, filed Oct. 25, 2019, entitled WIDE BAND TRANSVERSELY-EXCITED BULK ACOUSTIC WAVE RESONATORS WITH LOW LOSS ELECTRODES. application Ser. No. 16/779,255 is a continuation-in-part of application Ser. No. 16/578,811, filed Sep. 23, 2019, entitled TRANSVERSELY-EXCITED FILM BULK ACOUSTIC RESONATORS FOR HIGH POWER APPLICATIONS, now U.S. Pat. No. 10,637,438, which is a continuation-in-part of application Ser. No. 16/230,443, filed Dec. 21, 2018, entitled TRANSVERSELY-EXCITED FILM BULK ACOUSTIC RESONATOR, now U.S. Pat. No. 10,491,192, which claims priority from the following provisional patent applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to bandpass filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is less than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

The desire for wider communication channel bandwidths will inevitably lead to the use of higher frequency communications bands. Radio access technology for mobile telephone networks has been standardized by the 3GPP (3$^{rd}$ Generation Partnership Project). Radio access technology for 5$^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 use the same frequencies for both uplink and downlink transmissions. Bandpass filters for bands n77 and n79 must be capable of handling the transmit power of the communications device. The 5G NR standard also defines millimeter wave communication bands with frequencies between 24.25 GHz and 40 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
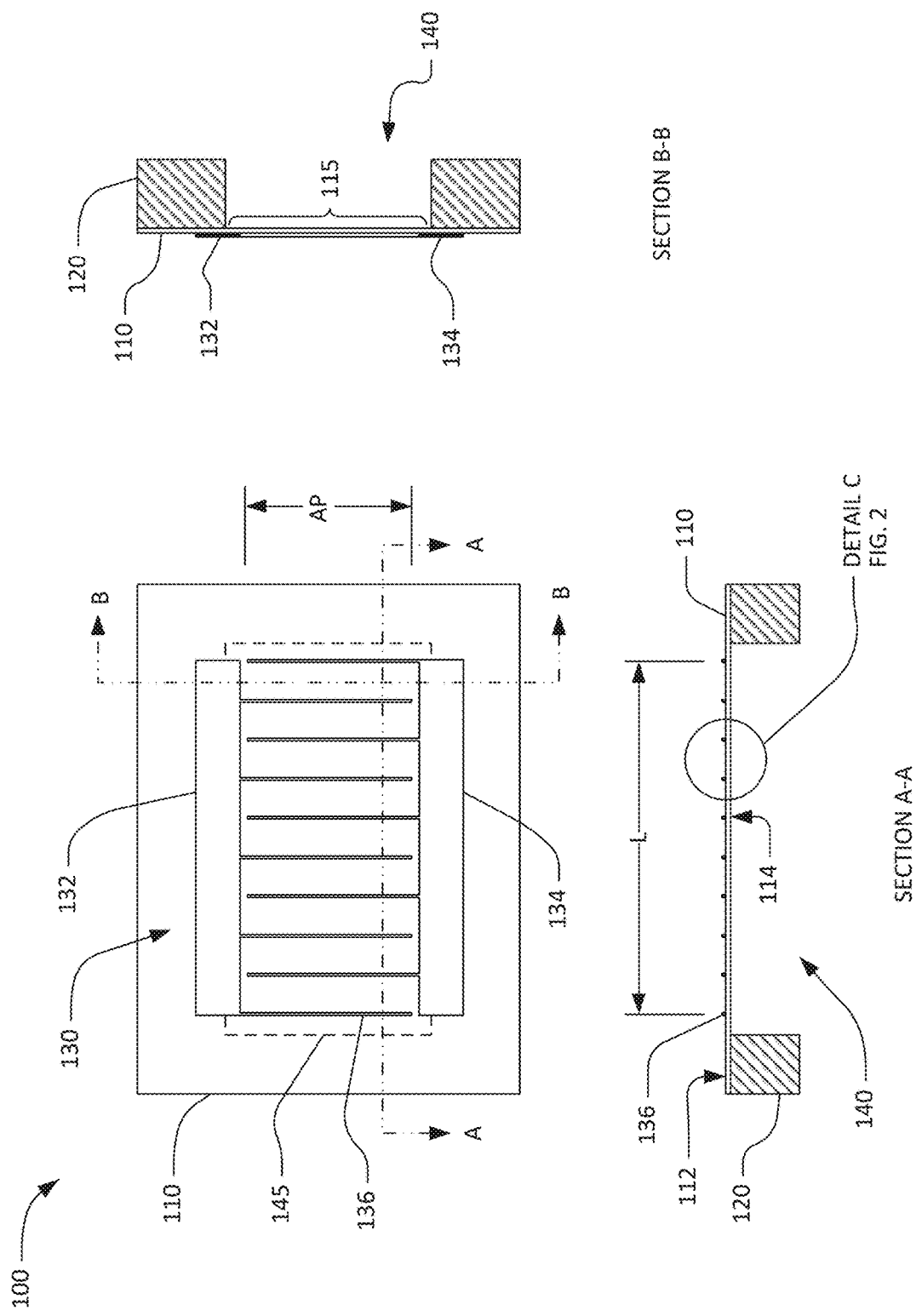
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut, rotated Z-cut, or rotated Y-cut. XBARs may be fabricated on piezoelectric plates with other crystallographic orientations.

The back surface 114 of the piezoelectric plate 110 is attached to a surface of the substrate 120 except for a portion of the piezoelectric plate 110 that forms a diaphragm 115 spanning a cavity 140 formed in the substrate. The portion of the piezoelectric plate that spans the cavity is referred to herein as the "diaphragm" 115 due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". In other configurations, the diaphragm 115 may be contiguous with the piezoelectric plate around at least 50% of the perimeter 145 of the cavity 140.

The substrate 120 provides mechanical support to the piezoelectric plate 110. The substrate 120 may be, for example, silicon, sapphire, quartz, or some other material or combination of materials. The back surface 114 of the piezoelectric plate 110 may be bonded to the substrate 120 using a wafer bonding process. Alternatively, the piezoelectric plate 110 may be grown on the substrate 120 or attached to the substrate in some other manner. The piezoelectric plate 110 may be attached directly to the substrate or may be attached to the substrate 120 via one or more intermediate material layers (not shown in FIG. 1).

"Cavity" has its conventional meaning of "an empty space within a solid body." The cavity 140 may be a hole completely through the substrate 120 (as shown in Section A-A and Section B-B) or a recess in the substrate 120 under the diaphragm 115. The cavity 140 may be formed, for example, by selective etching of the substrate 120 before or after the piezoelectric plate 110 and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the portion 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds of parallel fingers in the IDT 110. Similarly, the thickness of the fingers in the cross-sectional views is greatly exaggerated.

The dimensions of an XBAR scale inversely with frequency. For example, the resonance frequency of an XBAR can be reduce by 20% by increasing all of the dimensions of an XBAR by 20%. Since the resonance frequency of an XBAR is primarily determined by the thickness of the piezoelectric plate, it is convenient to express others dimensions relative to the piezoelectric plate thickness.

Figure 2:
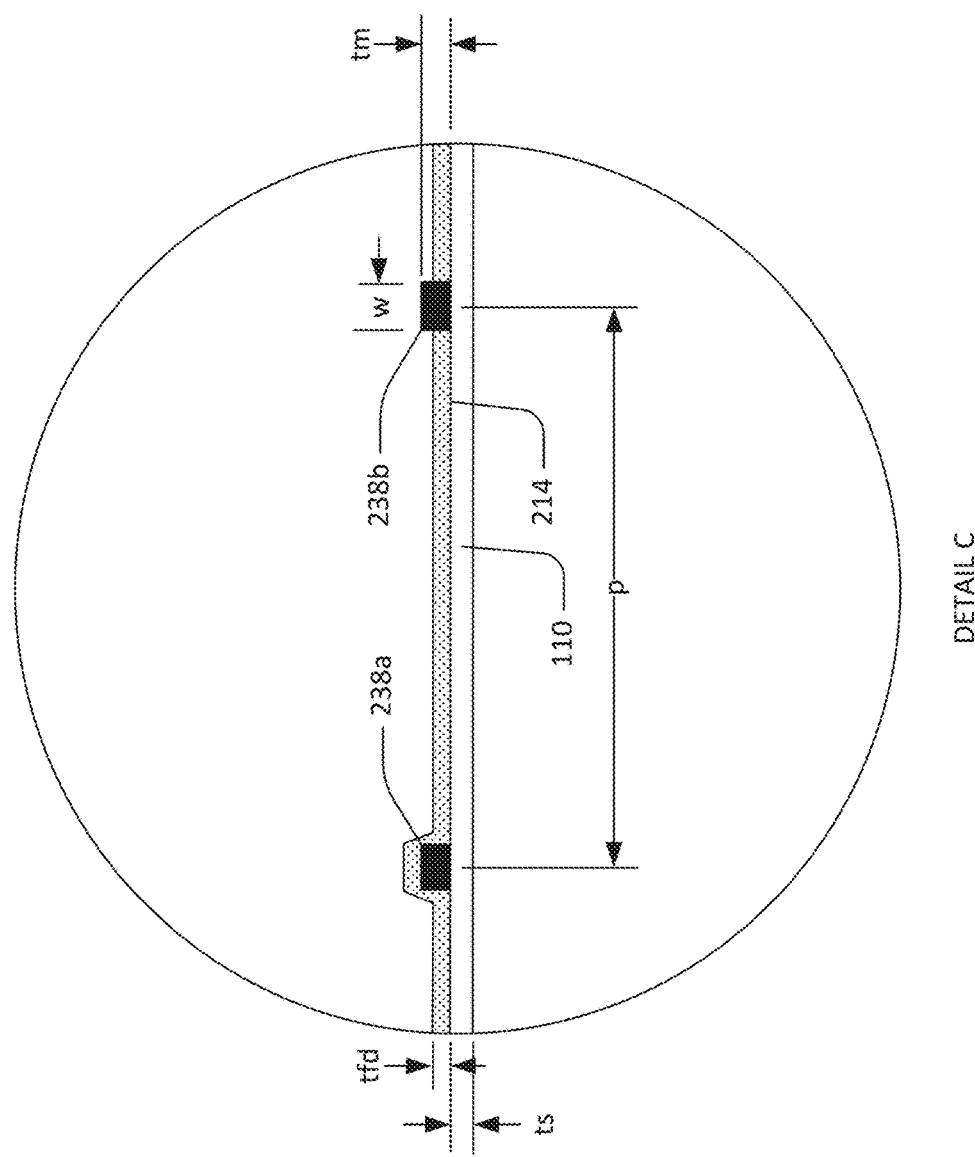
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts. Thickness ts may be, for example, 100 nm to 1500 nm. When used in filters for communications bands from 3.4 GHz to 6 GHz, the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 may be formed only between the IDT fingers (e.g. IDT finger 238b) or may be deposited as a blanket layer such that the dielectric layer is formed both between and over the IDT fingers (e.g. IDT finger 238a). The front-side dielectric layer 214 may be a non-piezoelectric dielectric material, such as silicon dioxide or silicon nitride. tfd may be, for example, 0 to 500 nm. tfd is typically less than the thickness ts of the piezoelectric plate. The front-side dielectric layer 214 may be formed of multiple layers of two or more materials.

The IDT fingers 238a and 238b may be aluminum, an aluminum alloy, copper, a copper alloy, beryllium, gold, tungsten, molybdenum or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. The IDT fingers are considered to be "substantially molybdenum" if they are formed from molybdenum or an alloy comprising at least 50% molybdenum. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an XBAR is not constrained to be near one-fourth of the acoustic wavelength at resonance. For example, the width of XBAR IDT fingers may be 500 nm or greater, such that the IDT can be readily fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3:
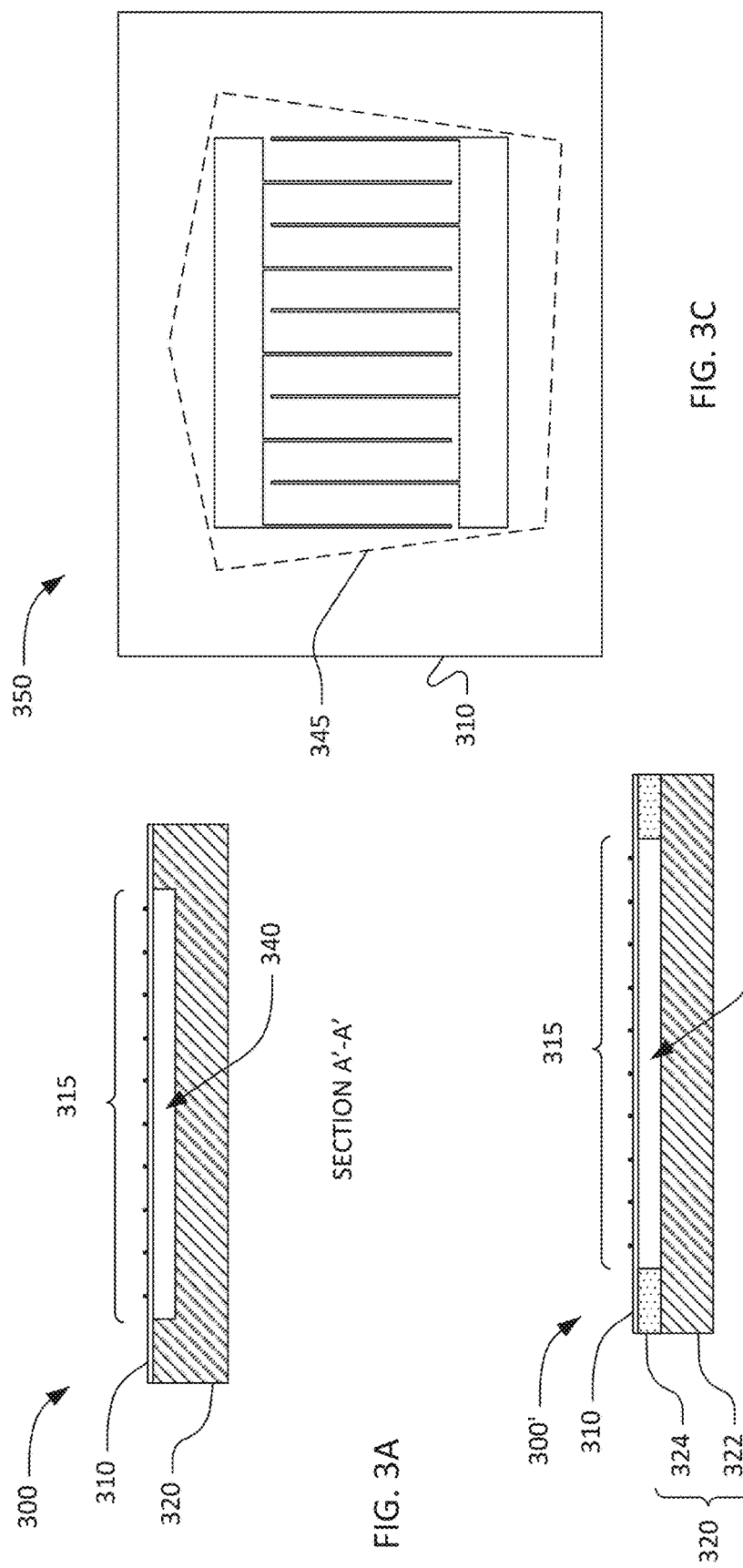
FIG. 3A is an alternative schematic cross-sectional view of the XBAR of FIG. 1.
FIG. 3B is another alternative schematic cross-sectional view of the XBAR of FIG. 1.
FIG. 3C is an alternative schematic plan view of an XBAR

FIG. 3A and FIG. 3B show two alternative cross-sectional views along the section plane A-A defined in FIG. 1. In XBAR 300 of FIG. 3A, a piezoelectric plate 310 is attached to a substrate 320. A portion of the piezoelectric plate 310 forms a diaphragm 315 spanning a cavity 340 in the substrate. The cavity 340 does not fully penetrate the substrate 320. Fingers of an IDT are disposed on the diaphragm 315. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings (not shown) provided in the piezoelectric plate 310. In this case, the diaphragm 315 may be contiguous with the rest of the piezoelectric plate 310 around a large portion of a perimeter 345 of the cavity 340. For example, the diaphragm 315 may contiguous with the rest of the piezoelectric plate 310 around at least 50% of the perimeter 345 of the cavity 340. An intermediate layer (not shown), such as a dielectric bonding layer, may be present between the piezo electric plate 340 and the substrate 320.

In in XBAR 300' of FIG. 3B, the substrate 320 includes a base 322 and an intermediate layer 324 disposed between the piezoelectric plate 310 and the base 322. For example, the base 322 may be silicon and the intermediate layer 324 may be silicon dioxide or silicon nitride or some other material. A portion of the piezoelectric plate 310 forms a diaphragm 315 spanning a cavity 340 in the intermediate layer 324. Fingers of an IDT are disposed on the diaphragm 315. The cavity 340 may be formed, for example, by etching the intermediate layer 324 before attaching the piezoelectric plate 310. Alternatively, the cavity 340 may be formed by etching the intermediate layer 324 with a selective etchant that reaches the substrate through one or more openings provided in the piezoelectric plate 310. In this case, the diaphragm 315 may be contiguous with the rest of the piezoelectric plate 310 around a large portion of a perimeter 345 of the cavity 340 (see FIG. 3C). For example, the diaphragm 315 may be contiguous with the rest of the piezoelectric plate 310 around at least 50% of the perimeter 345 of the cavity 340 as shown in FIG. 3C. Although not shown in FIG. 3B, a cavity formed in the intermediate layer 324 may extend into the base 322.

FIG. 3C is a schematic plan view of another XBAR 350. The XBAR 350 includes an IDT formed on a piezoelectric plate 310. A portion of the piezoelectric plate 310 forms a diaphragm spanning a cavity in a substrate. In this example, the perimeter 345 of the cavity has an irregular polygon shape such that none of the edges of the cavity are parallel, nor are they parallel to the conductors of the IDT. A cavity may have a different shape with straight or curved edges.

Figure 4:
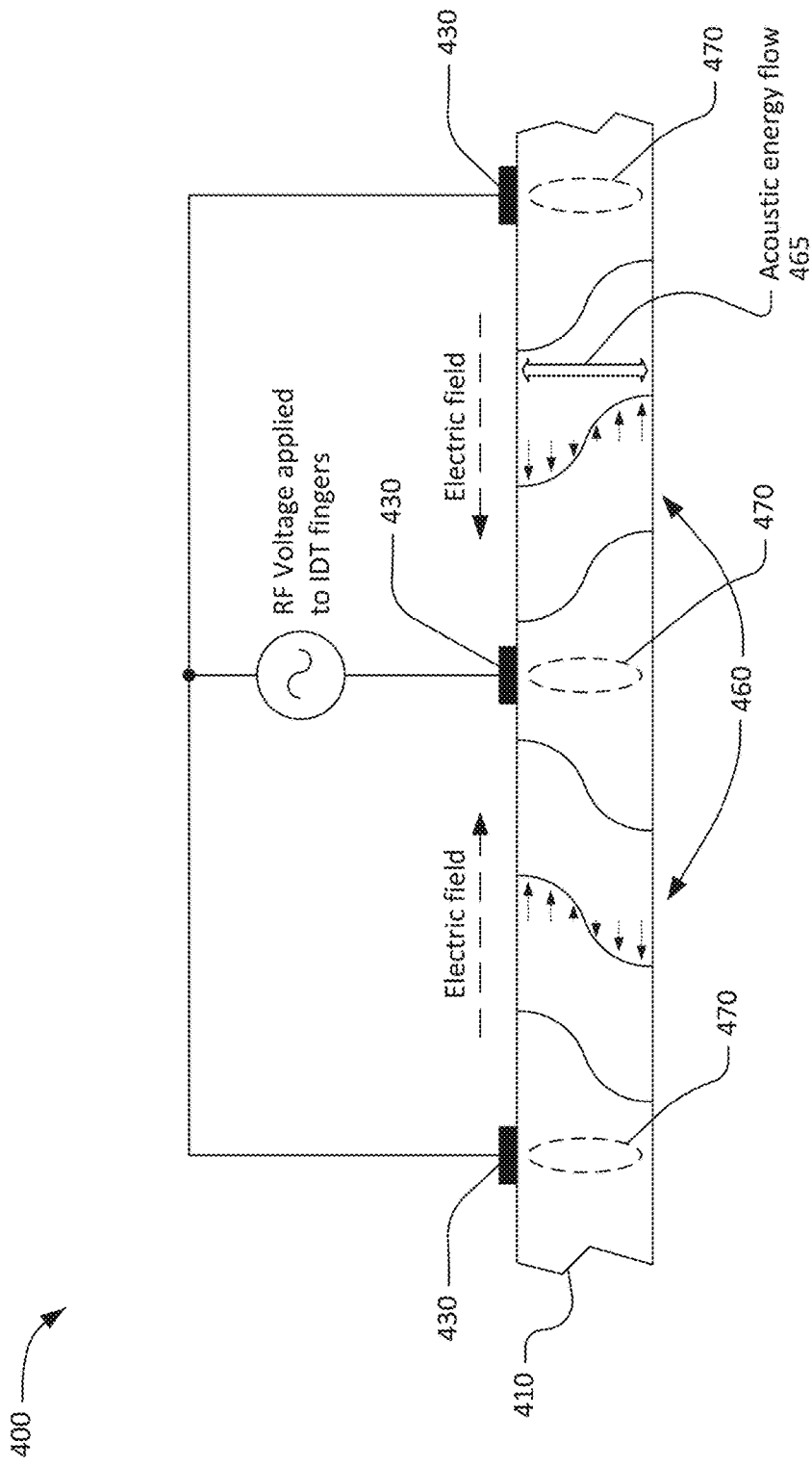
FIG. 4 is a graphic illustrating a primary acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430 which alternate in electrical polarity from finger to finger. An RF voltage is applied to the interleaved fingers 430. This voltage creates a time-varying electric field between the fingers. The direction of the electric field is predominantly lateral, or parallel to the surface of the piezoelectric plate 410, as indicated by the arrows labeled "electric field". Due to the high dielectric constant of the piezoelectric plate, the RF electric energy is highly concentrated inside the plate relative to the air. The lateral electric field introduces shear deformation which couples strongly to a shear primary acoustic mode (at a resonance frequency defined by the acoustic cavity formed by the volume between the two surfaces of the piezoelectric plate) in the piezoelectric plate 410. In this context, "shear deformation" is defined as deformation in which parallel planes in a material remain predominantly parallel and maintain constant separation while translating (within their respective planes) relative to each other. A "shear acoustic mode" is defined as an acoustic vibration mode in a medium that results in shear deformation of the medium. The shear deformations in the XBAR 400 are represented by the curves 460, with the adjacent small arrows providing a schematic indication of the direction and relative magnitude of atomic motion at the resonance frequency. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. The piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
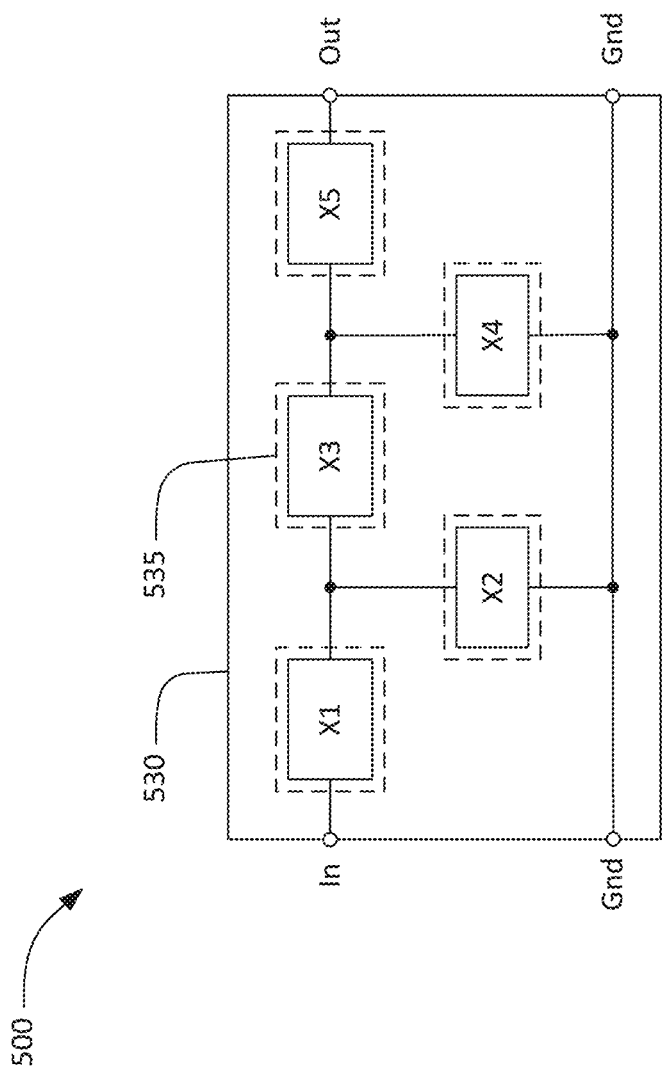
FIG. 5 is a schematic circuit diagram of a band-pass filter using acoustic resonators in a ladder circuit.

FIG. 5 is a schematic circuit diagram of a band-pass filter 500 using five XBARs X1-X5. The filter 500 may be, for example, a band n79 band-pass filter for use in a communication device. The filter 500 has a conventional ladder filter architecture including three series resonators X1, X3, X5 and two shunt resonators X2, X4. The three series resonators X1, X3, X5 are connected in series between a first port and a second port. In FIG. 5, the first and second ports are labeled "In" and "Out", respectively. However, the filter 500 is bidirectional and either port may serve as the input or output of the filter. The two shunt resonators X2, X4 are connected from nodes between the series resonators to ground. All the shunt resonators and series resonators are XBARs.

The three series resonators X1, X3, X5 and the two shunt resonators X2, X4 of the filter 500 maybe formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence. In FIG. 5, the cavities are illustrated schematically as the dashed rectangles (such as the rectangle 535). In this example, an IDT of each resonator is disposed over a respective cavity. In other filters, the IDTs of two or more resonators may be disposed over a common cavity. Resonators may also be cascaded into multiple IDTs which may be formed on multiple cavities.

Each of the resonators X1 to X5 has a resonance frequency and an anti-resonance frequency. In simplified terms, each resonator is effectively a short circuit at its resonance frequency and effectively an open circuit at its anti-resonance frequency. Each resonator X1 to X5 creates a "transmission zero", where the transmission between the in and out ports of the filter is very low. Note that the transmission at a "transmission zero" is not actually zero due to energy leakage through parasitic components and other effects. The three series resonators X1, X3, X5 create transmission zeros at their respective anti-resonance frequencies (where each resonator is effectively an open circuit). The two shunt resonators X2, X4 create transmission zeros at their respective resonance frequencies (where each resonator is effectively a short circuit). In a typical band-pass filter using acoustic resonators, the anti-resonance frequencies of the series resonators create transmission zeros above the passband, and the resonance frequencies of the shunt resonators create transmission zeros below the passband.

A band-pass filter for use in a communications device, such as a cellular telephone, must meet a variety of requirements. First, a band-pass filter, by definition, must pass, or transmit with acceptable loss, a defined pass-band. Typically, a band-pass filter for use in a communications device must also stop, or substantially attenuate, one or more stop band(s). For example, a band n79 band-pass filter is typically required to pass the n79 frequency band from 4400 MHz to 5000 MHz and to stop the 5 GHz WiFi™ band and/or the n77 band from 3300 MHz to 4200 MHz. To meet these requirements, a filter using a ladder circuit would require series resonators with anti-resonance frequencies about or above 5100 MHz, and shunt resonators with resonance frequencies about or below 4300 MHz.

Another typical requirement on a band-pass filter for use in a communications device is the input and output impedances of the filter have to match, at least over the pass-band of the filter, the impedances of other elements of the communications device to which the filter is connected (e.g. a transmitter, receiver, and/or antenna) for maximum power transfer. Commonly, the input and output impedances of a band-pass filter are required to match a 50-ohm impedance within a tolerance that may be expressed, for example, as a maximum return loss or a maximum voltage standing wave ratio. When necessary, an impedance matching network comprising one or more reactive components can be used at the input and/or output of a band-pass filter. Such impedance matching networks add to the complexity, cost, and insertion loss of the filter and are thus undesirable. To match, without additional impedance matching components, a 50-Ohm impedance at a frequency of 5 GHz, the capacitances of at least the shunt resonators in the band-pass filter need to be in a range of about 0.5 picofarads (pF) to about 1.5 picofarads.

The metal fingers of the IDTs provide the primary mechanism for removing heat from an XBAR resonator. Increasing the aperture of a resonator increases the length and the electrical and thermal resistance of each IDT finger. Further, for a given IDT capacitance, increasing the aperture reduces the number of fingers required in the IDT, which, in turn, proportionally increases the RF current flowing in each finger. All of these effects argue for using the smallest possible aperture in resonators for high-power filters.

Conversely, several factors argue for using a large aperture. First, the total area of an XBAR resonator includes the area of the IDT and the area of the bus bars. The area of the bus bars is generally proportional to the length of the IDT. For very small apertures, the area of the IDT bus bars may be larger than the area occupied by the interleaved IDT fingers. Further, some electrical and acoustic energy may be lost at the ends of the IDT fingers. These loss effects become more significant as IDT aperture is reduced and the total number of fingers is increased. These losses may be evident as a reduction in resonator Q-factor, particularly at the anti-resonance frequency, as IDT aperture is reduced.

As a compromise between conflicting objectives, resonator apertures will typically fall in the range from 20 µm and 60 µm for 5 GHz resonance frequency. Resonator aperture may scale inversely with frequency.

Communications devices operating in time-domain duplex (TDD) bands transmit and receive in the same frequency band. Both the transmit and receive signal paths pass through a common bandpass filter connected between an antenna and a transceiver. Communications devices operating in frequency-domain duplex (FDD) bands transmit and receive in different frequency bands. The transmit and receive signal paths pass through separate transmit and receive bandpass filters connected between an antenna and the transceiver. Filters for use in TDD bands or filters for use as transmit filters in FDD bands can be subjected to radio frequency input power levels of 30 dBm or greater and must avoid damage under power.

The required insertion loss of acoustic wave bandpass filters is usually not more than a few dB. Some portion of this lost power is return loss reflected back to the power source; the rest of the lost power is dissipated in the filter. Typical band-pass filters for LTE bands have surface areas of 1.0 to 2.0 square millimeters. Although the total power dissipation in a filter may be small, the power density can be high given the small surface area. Further, the primary loss mechanisms in an acoustic filter are resistive losses in the conductor patterns and acoustic losses in the IDT fingers and piezoelectric material. Thus, the power dissipation in an acoustic filter is concentrated in the acoustic resonators. To prevent excessive temperature increase in the acoustic resonators, the heat due to the power dissipation must be conducted away from the resonators through the filter package to the environment external to the filter.

In traditional acoustic filters, such as surface acoustic wave (SAW) filters and bulk acoustic wave (BAW) filters, the heat generated by power dissipation in the acoustic resonators is efficiently conducted through the filter substrate and the metal electrode patterns to the package. In an XBAR device, the resonators are disposed on thin piezoelectric diaphragms that are inefficient heat conductors. The large majority of the heat generated in an XBAR device must be removed from the resonator via the IDT fingers and associated conductor patterns.

The electric resistance of the IDT fingers can be reduced, and the thermal conductivity of the IDT fingers can be increased, by increasing the cross-sectional area of the fingers to the extent possible. Changing the width and/or thickness of the IDT fingers has minimal effect on the primary acoustic mode in an XBAR device. This is a very uncommon situation for an acoustic wave resonator. However, the IDT finger geometry does have a substantial effect on coupling to spurious acoustic modes, such as higher order shear modes and plate modes that travel laterally in the piezoelectric diaphragm.

Figure 6:
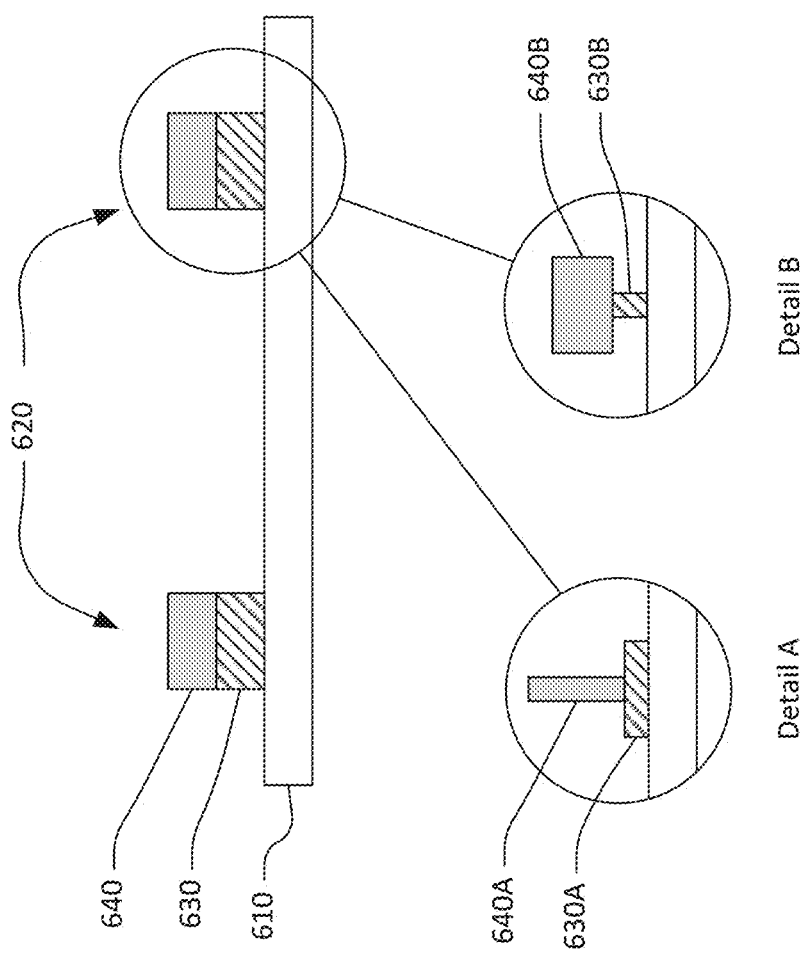
FIG. 6 is a cross-sectional view and two detailed cross-sectional views of a portion of an XBAR with two-layer interdigital transducer (IDT) fingers.

FIG. 6 is a cross-sectional view of a portion of an XBAR with two-layer IDT fingers. FIG. 6 shows a cross section though a portion of a piezoelectric diaphragm 610 and two IDT fingers 620. Each IDT finger 620 has two metal layers 630, 640. The lower (as shown in FIG. 6) layer 630 may be a metal with low transverse acoustic impedance, such as aluminum, copper, molybdenum, silver, or titanium. Transverse acoustic impedance is the product of density and shear wave velocity. The lower layer 630 may be adjacent the diaphragm 610 or separated from the diaphragm 610 by a thin intermediate layer (not shown) used to improve adhesion between the diaphragm 610 and the lower layer 630. The upper layer 640 may be a metal with high transverse acoustic impedance, such as chromium, gold, tungsten, or platinum. The transition from low to high transverse acoustic impedance may confine some spurious modes to the lower layer 630. The use of a metal with low acoustic loss or low viscosity for the lower layer 630 closest to the diaphragm 610, where the acoustic stresses are greatest, may reduce acoustic losses in the XBAR. Having two metal layers 630, 640 allows the designer to have additional design options to further improve performance of the XBAR.

Further, the two metal layers need not have the same thickness or cross-sectional shape, as shown in Detail A and Detail B of FIG. 6. In Detail A, the second metal layer 640A of each IDT finger has the form of a tall narrow rib on top of a thinner (shorter), wider first metal layer 630A. In Detail B, each IDT finger has a "T" cross section form by a narrow first metal layer 630B and a wider second metal layer 640B. The cross-section shapes of the first and second metal layers are not limited to rectangular as shown in FIG. 6. Other cross-sectional shapes including trapezoidal and triangular may be used and may be beneficial to minimize or control spurious acoustic modes. The cross-sectional shapes can also be irregular, meaning the cross-sectional shape has sides and angles of any length and size that are not necessarily equal to each other.

Figure 7:
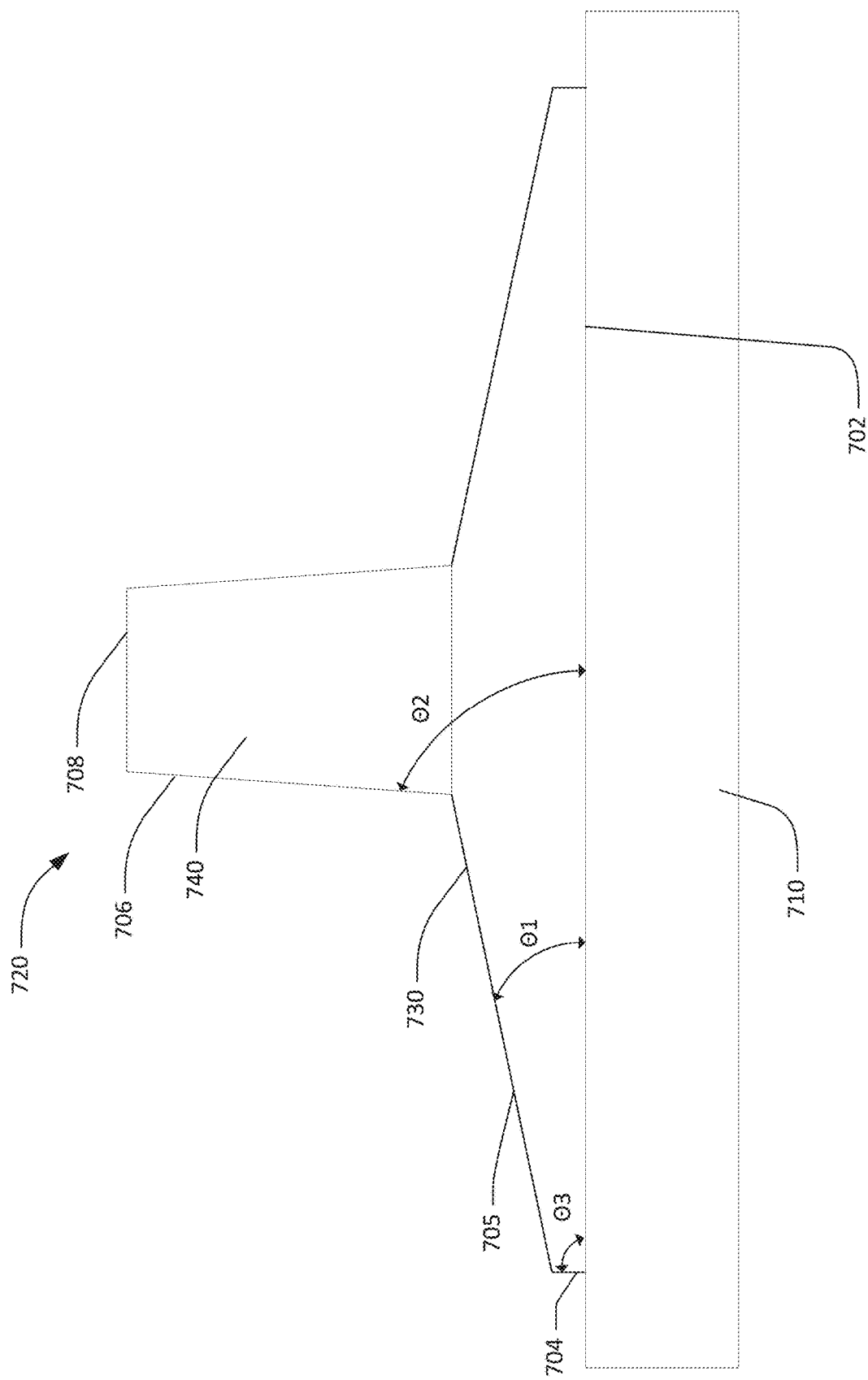
FIG. 7 is a cross-sectional view of an IDT finger having a pedestal-like cross-sectional shape with a lower layer that is wider than an upper layer.

FIG. 7 is a cross-sectional view of an IDT finger 720 with a pedestal-like cross-sectional shape, having a lower layer that is wider than an upper layer, which may reduce spurious modes. The finger 720 has a lower layer 730 with a bottom surface 702 contacting the top surface of diaphragm 710, which is substantially parallel to the bottom surface. The lower layer 730 also has a sidewall 704 extending from the bottom surface 702 at an angle $\theta 3$, which can be substantially orthogonal to the bottom surface 702. The lower layer 730 further has a sloped top surface 705 extending at an angle $\theta 1$ to the bottom surface 702, where $\theta 1$ is in a range from 10 degrees to 40 degrees. The finger 720 has an upper layer 740 on the lower layer 730 opposite the diaphragm 710. The upper layer 740 has a sidewall 706 that extends at a sidewall angle $\theta 2$ to the diaphragm 710 towards a top surface 708 of the finger 720, wherein $\theta 2$ is in a range from 70 degrees to 90 degrees.

The lower layer 730 and the upper layer 740 may be formed of the same materials or different materials. If formed of different materials, the lower layer 730 may be a metal with low transverse acoustic impedance. The upper layer 740 may be a material having high transverse acoustic impedance. In other examples, the thickness of the lower layer could be in a range from 15% to 75% of the thickness of the diaphragm, and the thickness of the upper layer could be in a range from 15% to 75% of the thickness of the diaphragm.

The sidewalls 706 of the upper layer 740 can be are substantially longer than the sidewalls 704 of the lower layer 730, resulting in a "pedestal" cross-sectional shape for the finger. Pedestal-shaped shaped fingers can be optimized to mitigate internal resonance near resonance and anti-resonance frequencies.

Figure 8:
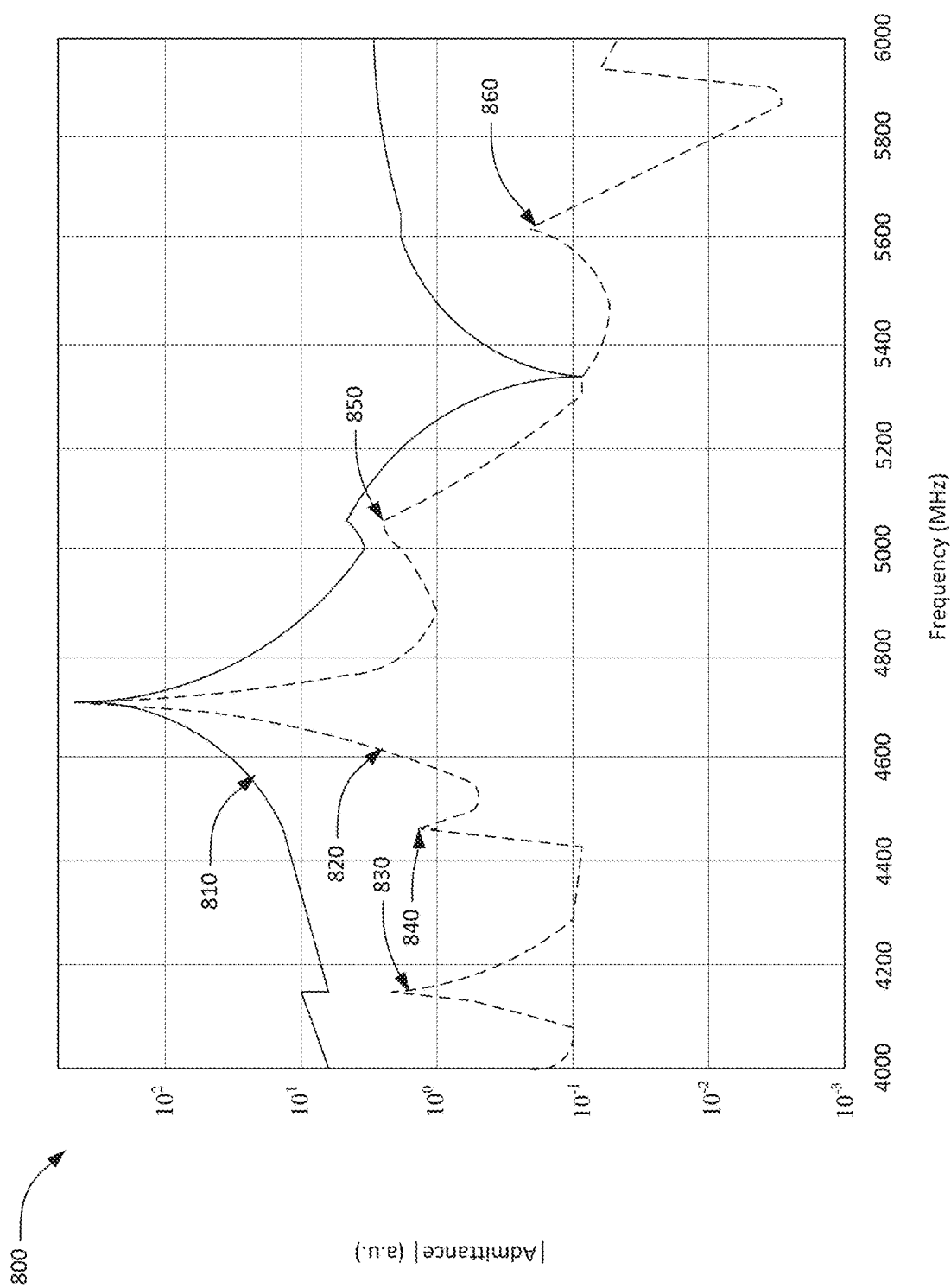
FIG. 8 is a chart illustrating simulated frequency versus admittance for an XBAR with IDT fingers having a trapezoidal cross-sectional shape.

FIG. 8 is a chart 800 of simulated frequency versus admittance for an XBAR with IDT fingers having a single layer with a trapezoidal cross-sectional shape formed of 600 nm thick aluminum. The pitch is 3.55 microns, the mark is 1.085 microns, and the diaphragm thickness is 400 nm. The resonance frequency is 4707 MHz with a Q value of 370, and the anti-resonance is 5335 MHz with a Q value of 290. Solid curve 810 is a plot of the magnitude of admittance, and dashed curve 820 indicates the real component of admittance. Spurious modes are indicated at 830, 840, 850, and 860, with the spurious mode at 850 being particularly objectionable since it is likely to be in the passband of the a filter using this resonators.

Figure 9:
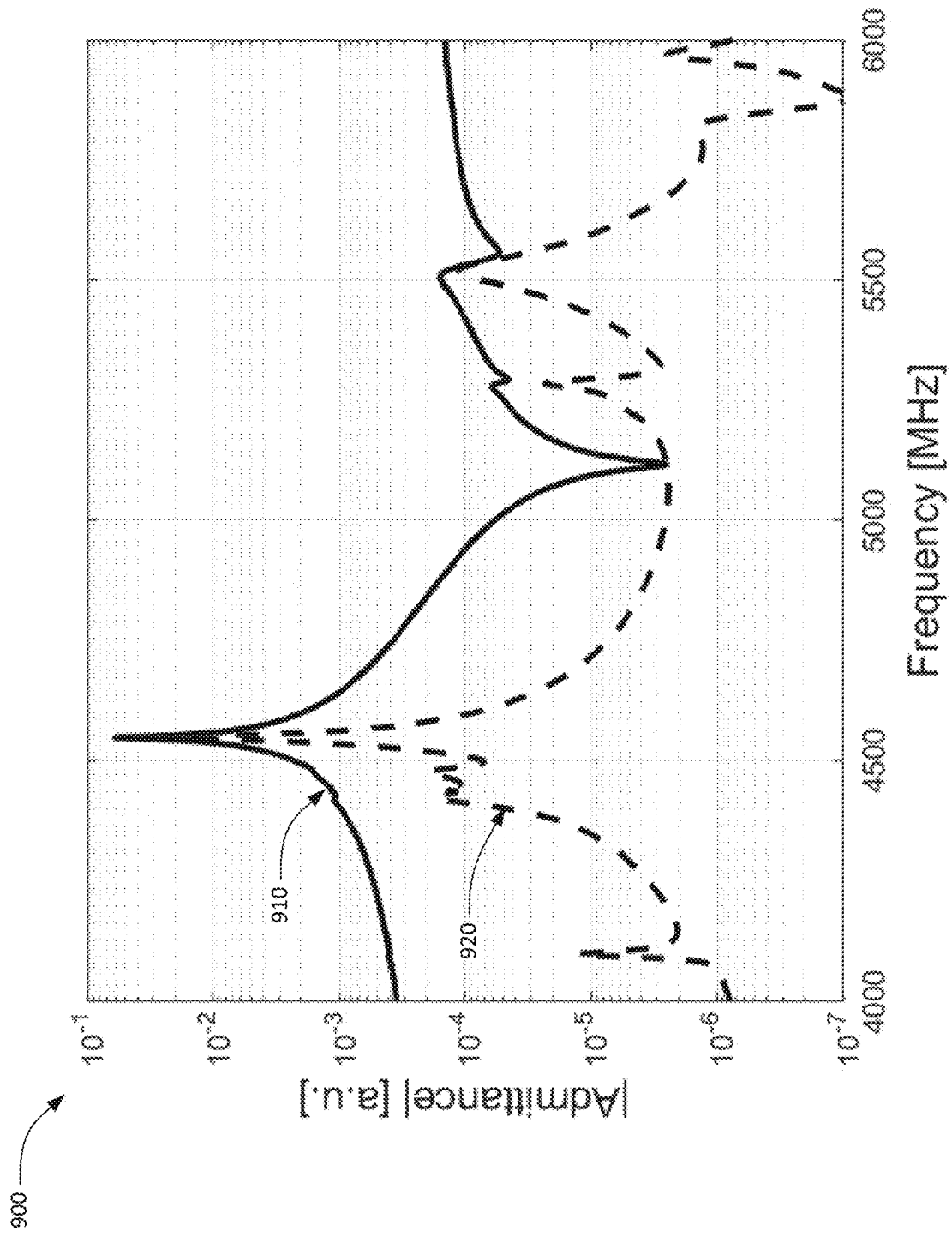
FIG. 9 is a chart illustrating simulated frequency versus admittance for an XBAR with IDT fingers having a pedestal-like cross-sectional shape.

FIG. 9 is a chart 900 of simulated admittance versus frequency for an XBAR with IDT fingers having a pedestal cross-sectional shape formed of 530 nm thick aluminum. The pitch is 3.55 microns, and the diaphragm thickness is 410 nm. A width of the lower layer is 1.4 microns. A height of the portion of the lower layer with the sidewall at an angle of $\theta 3$ to the diaphragm is 30 nm. A height of a portion of the lower layer with the sidewall at an angle of $\theta 1$ to the diaphragm is 79 nm. A width of the upper layer at its base is 0.5 microns, and a height of the upper layer is 421 nm. In this example, the sidewall of the upper layer is at an angle of 80 degrees to the diaphragm, and the sloped top surface of the lower layer is an angle of 10 degrees to the diaphragm. The resonance frequency is about 4550 MHz, and the anti-resonance frequency is 5130 MHz. Solid curve 910 is a plot of the magnitude of admittance, and dashed curve 920 indicates the real component of admittance. Spurious modes are reduced in this example as compared to the example in FIG. 8

Figure 10:
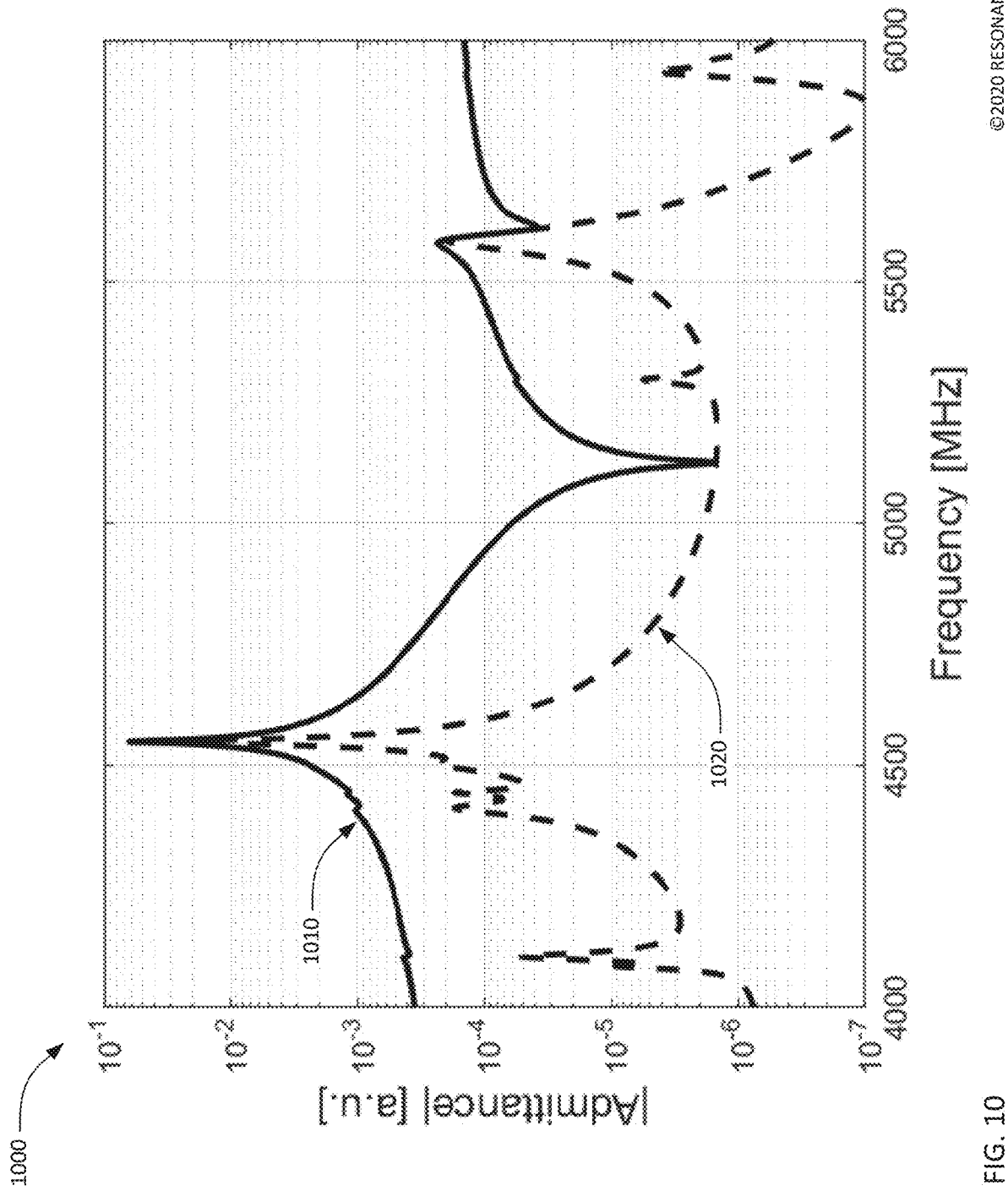
FIG. 10 is a chart illustrating simulated frequency versus admittance for another XBAR with IDT fingers having a pedestal-like cross-sectional shape.

FIG. 10 is a chart 1000 of simulated admittance versus frequency for an XBAR with IDT fingers having a pedestal cross-sectional shape formed of 530 nm thick aluminum. The pitch is 3.55 microns, and the diaphragm thickness is 410 nm. A width of the lower layer is 1.4 microns. A height of the portion of the lower layer with the sidewall at an angle of $\theta 3$ to the diaphragm is 30 nm. A height of a portion of the lower layer with the sidewall at an angle of $\theta 1$ to the diaphragm is 88 nm. A width of the upper layer at its base is 0.4 microns, and a height of the upper layer is 421 nm. In this example, the sidewall of the upper layer is at an angle of 80 degrees to the diaphragm, and the sloped top surface of the lower layer is an angle of 15 degrees to the diaphragm. The resonance frequency is 4548 MHz with a Q value of 1320, and the anti-resonance frequency is 5123 MHz with a Q value of 640. Solid curve 1010 is a plot of the magnitude of admittance, and dashed curve 1020 indicates the real component of admittance. Spurious modes are reduced in this example as compared to the example in FIG. 8.

Figure 11:
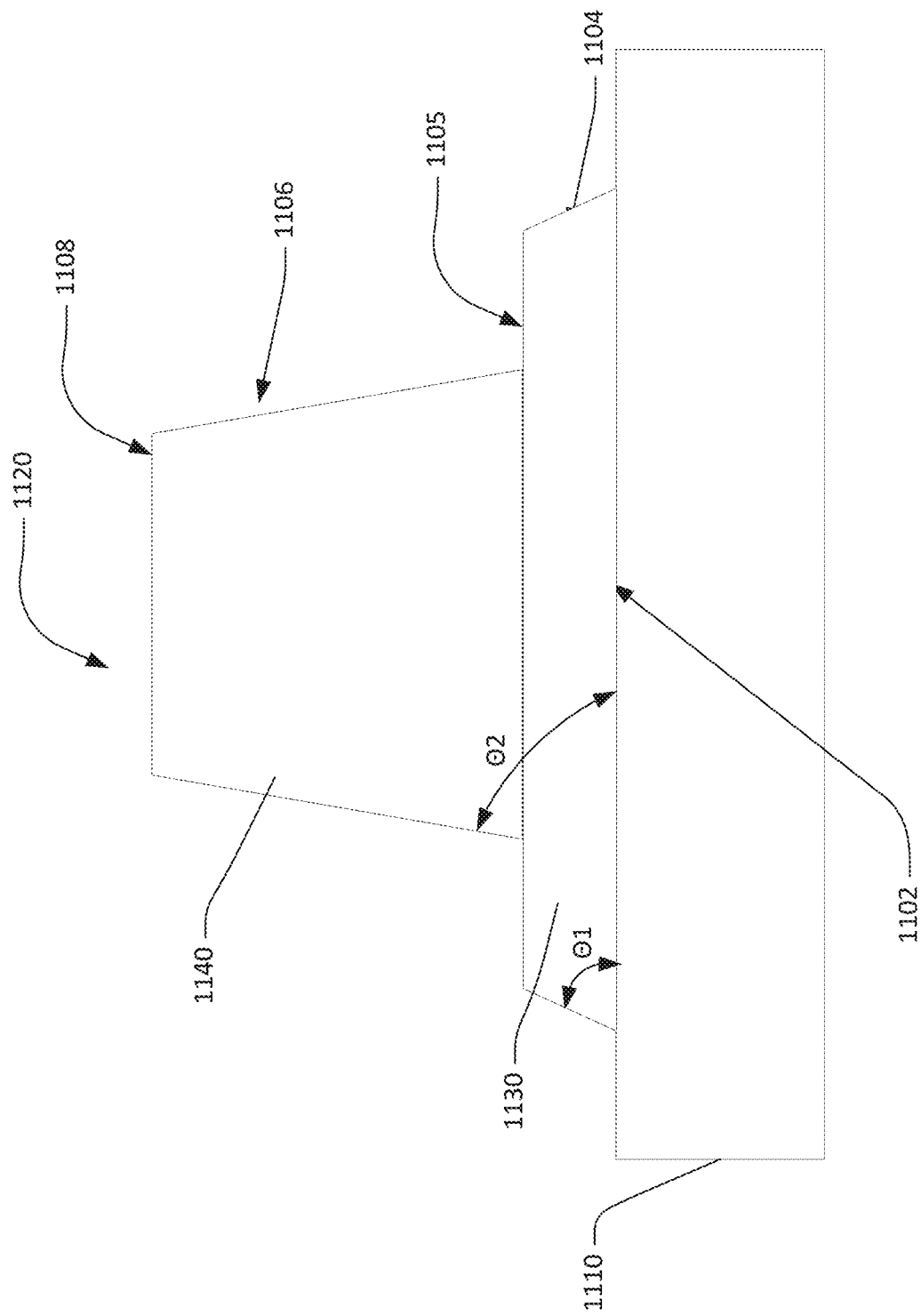
FIG. 11 is a cross-sectional view of an IDT finger having a wedding cake-like cross-sectional shape with a lower layer that is wider than an upper layer.

FIG. 11 is a cross-sectional view of an IDT finger 1120 with a wedding cake-like cross-sectional shape, having a lower layer that is wider than an upper layer, which may reduce spurious modes. The finger 1120 has a lower layer 1130 with a bottom surface 1102 contacting the top surface of diaphragm 1110, which is substantially parallel to the bottom surface 1104. The lower layer 1130 also has a sidewall 1104 extending at a sidewall angle $\theta 1$ to the bottom surface 1102 forming an isosceles trapezoid shape, where $\theta 1$ can be in a range from 70 degrees to 90 degrees. The finger 1120 has an upper layer 1140 on a top surface 1105 of the lower layer 1130 opposite the diaphragm 1110. The upper layer 1140 has a sidewall 1106 that extends at a sidewall angle $\theta 2$ to the diaphragm 1110 towards a top surface 1108 of the finger 1120, forming a different isosceles trapezoid shape, where $\theta 2$ can be in a range from 70 degrees to 90 degrees.

The lower layer 1130 and the upper layer 1140 may be formed of the same materials or different materials. If formed of different materials, the lower layer 1130 may be a metal with low transverse acoustic impedance. The upper layer 1140 may be a material having high transverse acoustic impedance. In other examples, the thickness of the lower layer could be in a range from 15% to 75% of the thickness of the diaphragm, and the thickness of the upper layer could be in a range from 15% to 75% of the thickness of the diaphragm.

The sidewalls 1106 of the upper layer 1140 can be are substantially longer than the sidewalls 1104 and 1105 of the lower layer 1130, resulting in a "wedding cake" cross-sectional shape for the finger that can be optimized to mitigate internal resonance near resonance and anti-resonance frequencies.

Figure 12:
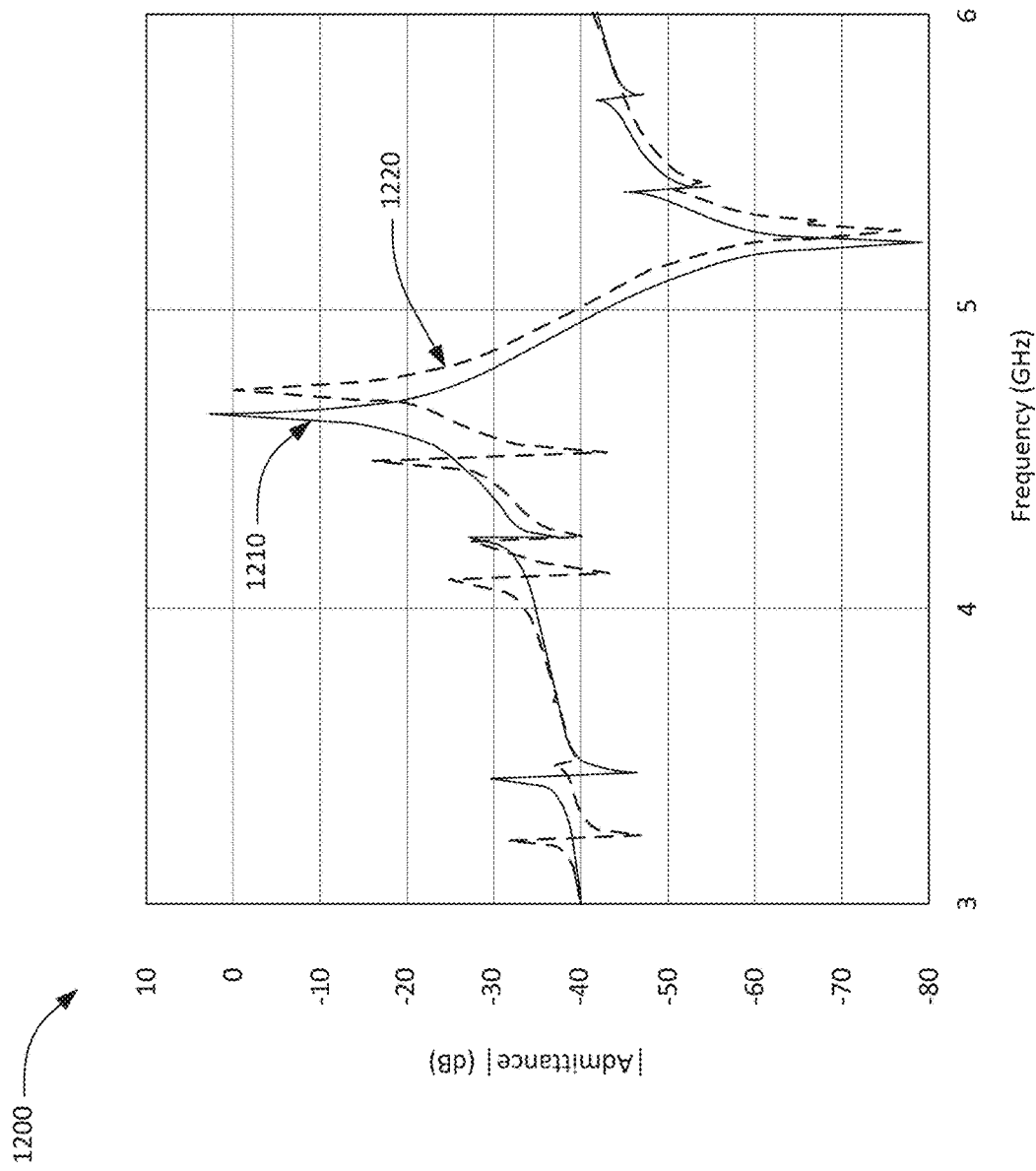
FIG. 12 is a chart illustrating simulated frequency versus admittance for an XBAR with IDT fingers having a trapezoidal cross-sectional shape and a wedding cake-like cross-sectional shape.

FIG. 12 is a chart 1200 illustrating differences between a simulated XBAR with a single layer IDT and a simulated XBAR with a two-layer IDT finger, as shown in FIG. 11. Solid curve 1210 is a plot of the magnitude of the admittance of an XBAR with an IDT finger formed of a 100 nm thick lower layer of aluminum and a 350 nm thick upper layer of aluminum, as shown in FIG. 11. The sidewall of the lower and upper layers is at an angle of 80 degrees to the diaphragm. The cross-sectional area of the IDT finger of curve 1210 is equivalent to the cross-sectional area of a single layer IDT finger with a 240 nm thickness. Dashed curve 1220 is a plot of the magnitude of the admittance of an XBAR with an IDT finger formed of a single layer of 400 nm thick aluminum. The sidewall is at an angle of 80 degrees to the diaphragm. For both curves, the pitch is 3.55 microns, the mark is 1.115 microns, and the diaphragm thickness is 406 nm. The number and amplitude of the spurs is reduced in curve 1210, as compared to curve 1220.

In other examples, the thickness of the lower layer could be in a range from 100 nm to 300 nm, and the thickness of the upper layer could be in a range from 100 nm to 300 nm. The upper layer and the lower layer can be formed of the same or different materials. Further, the lower layer can be formed of any of the suitable low transverse acoustic impedance materials listed herein, and the upper layer can be formed of any of the suitable high transverse acoustic impedance materials listed herein.

DESCRIPTION OF METHODS

Figure 13:
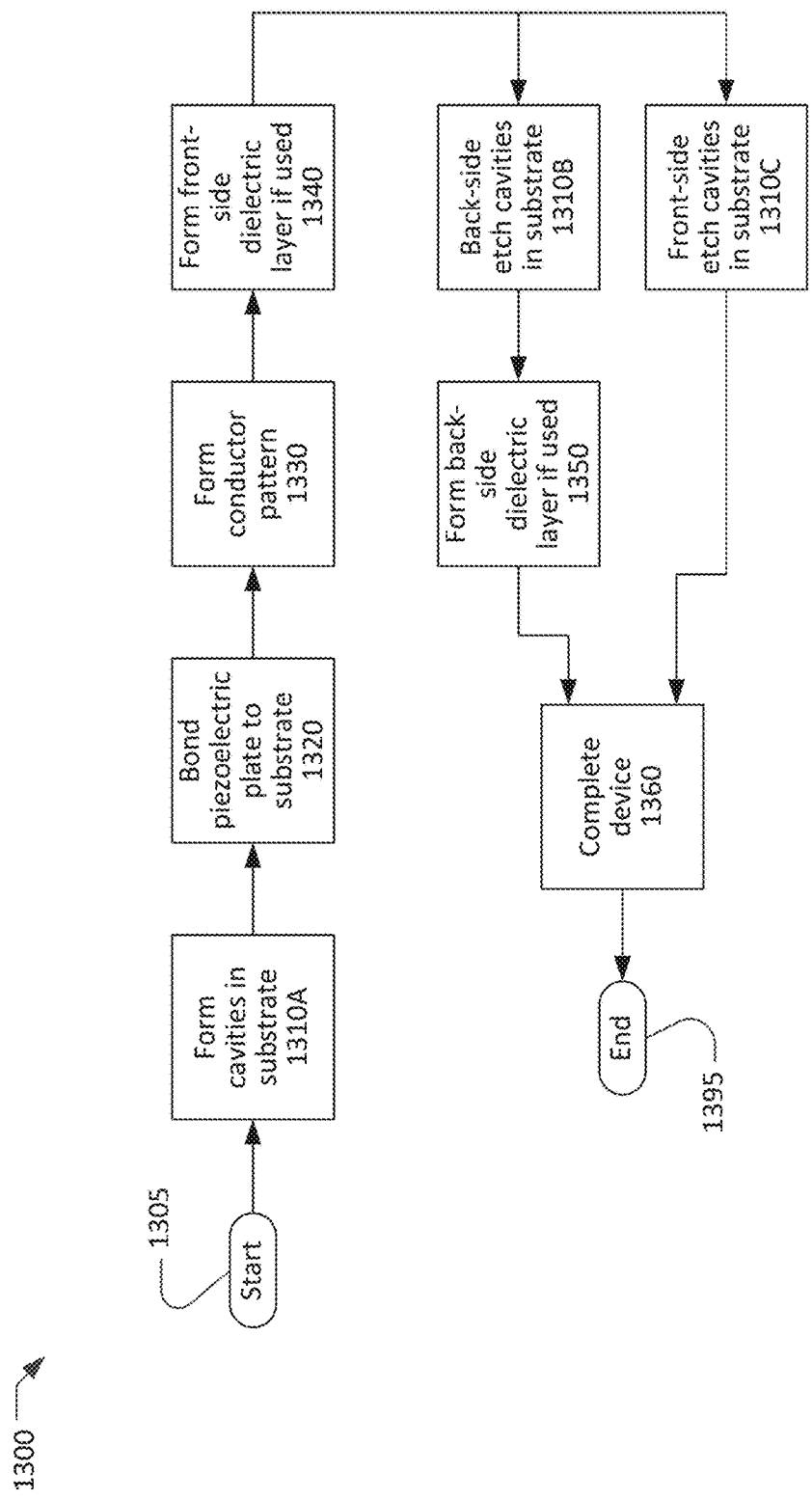
FIG. 13 is a flow chart of a process for fabricating an XBAR or a filter including XBARs.

FIG. 13 is a simplified flow chart showing a process 1300 for making an XBAR or a filter incorporating XBARs. The process 1300 starts at 1005 with a substrate and a plate of piezoelectric material and ends at 1395 with a completed XBAR or filter. The flow chart of FIG. 13 includes only major process steps. Various conventional process steps (e.g. surface preparation, cleaning, inspection, baking, annealing, monitoring, testing, etc.) may be performed before, between, after, and during the steps shown in FIG. 13.

The flow chart of FIG. 13 captures three variations of the process 1300 for making an XBAR which differ in when and how cavities are formed in the substrate. The cavities may be formed at steps 1310A, 1310B, or 1310C. Only one of these steps is performed in each of the three variations of the process 1300.

The piezoelectric plate may be, for example, Z-cut lithium niobate or lithium tantalate with Euler angles 0, 0, 90°. The piezoelectric plate may be rotated Z-cut lithium niobate with Euler angles 0, β, 90°, where β is in the range from −15° to +5°. The piezoelectric plate may be rotated Y-cut lithium niobate with Euler angles 0, β, 0, where β is in the range from 0 to 60°. The piezoelectric plate may be some other material or crystallographic orientation. The substrate may preferably be silicon. The substrate may be some other material that allows formation of deep cavities by etching or other processing.

In one variation of the process 1300, one or more cavities are formed in the substrate at 1310A, before the piezoelectric plate is bonded to the substrate at 1320. A separate cavity may be formed for each resonator in a filter device. The one or more cavities may be formed using conventional photolithographic and etching techniques. Typically, the cavities formed at 1310A will not penetrate through the substrate.

At 1320, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 1330 by depositing and patterning one or more conductor layer on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1330 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1330 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

When the IDT fingers have multiple layers, the layers may be deposited and patterned separately. In particular, different patterning processes (i.e. etching or lift-off) may be used on different layers and different masks are required where two or more layers have different widths or shapes.

At 1340, a front-side dielectric layer may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

In a second variation of the process 1300, one or more cavities are formed in the back side of the substrate at 1310B. A separate cavity may be formed for each resonator in a filter device. The one or more cavities may be formed using an anisotropic or orientation-dependent dry or wet etch to open holes through the back side of the substrate to the piezoelectric plate. In this case, the resulting resonator devices will have a cross-section as shown in FIG. 1.

In the second variation of the process 1300, a back-side dielectric layer may be formed at 1350. In the case where the cavities are formed at 1310B as holes through the substrate, the back-side dielectric layer may be deposited through the cavities using a conventional deposition technique such as sputtering, evaporation, or chemical vapor deposition.

In a third variation of the process 1300, one or more cavities in the form of recesses in the substrate may be formed at 1310C by etching the substrate using an etchant introduced through openings in the piezoelectric plate. A separate cavity may be formed for each resonator in a filter device.

In all variations of the process 1300, the filter device is completed at 1360. Actions that may occur at 1360 include depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1360 is to tune the resonant frequencies of the resonators within the device by adding or removing metal or dielectric material from the front side of the device. After the filter device is completed, the process ends at 1395.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
   a substrate having a surface;
   a single-crystal piezoelectric plate having front and back surfaces, the back surface attached to the surface of the substrate except for a portion of the piezoelectric plate forming a diaphragm that spans a cavity in the substrate; and
   an interdigital transducer formed on the front surface of the piezoelectric plate, interleaved fingers of the IDT disposed on the diaphragm configured such that a radio frequency signal applied to the IDT excites a primary shear acoustic mode in the diaphragm,
   wherein the interleaved fingers comprise a first layer adjacent the diaphragm and a second layer over the first layer, the second layer having a narrower width than the first layer.

2. The device of claim 1, wherein the first layer is a different material than the second layer.

3. The device of claim 2, wherein the first layer comprises a low transverse acoustic impedance metal.

4. The device of claim 2, wherein the second layer comprises a high transverse acoustic impedance metal.

5. The device of claim 2, wherein the first layer comprises aluminum or titanium.

6. The device of claim 2, wherein the second layer comprises chromium or tungsten.

7. The device of claim 1, wherein a thickness of the first layer is less than a thickness of the second layer.

8. The device of claim 1, wherein the second layer has an irregular shape.

9. The device of claim 1, wherein a direction of acoustic energy flow of the primary acoustic mode is substantially normal to the front and back surfaces of the diaphragm.

10. A filter device comprising:
    a substrate having a surface;
    a single-crystal piezoelectric plate having front and back surfaces, the back surface attached to the surface of the substrate, portions of the piezoelectric plate forming one or more diaphragms spanning respective cavities in the substrate; and
    a conductor pattern formed on the front surface, the conductor pattern including a plurality of interdigital transducers (IDTs) of a respective plurality of acoustic resonators, interleaved fingers of each of the plurality of IDTs disposed on one of the one or more diaphragms, the piezoelectric plate and all of the IDTs configured such that respective radio frequency signals applied to each IDT excite respective shear primary acoustic modes in the respective diaphragm,
    wherein the interleaved fingers comprise a first layer adjacent the one or more diaphragms and a second layer over the first layer, the second layer having a narrower width than the first layer.

11. The device of claim 10, wherein the first layer is a different material than the second layer.

12. The device of claim 11, wherein the first layer comprises a low transverse acoustic impedance metal.

13. The device of claim 11, wherein the second layer comprises a high transverse acoustic impedance metal.

14. The device of claim 11, wherein the first layer comprises aluminum or titanium.

15. The device of claim 11, wherein the second layer comprises chromium or tungsten.

16. The device of claim 10, wherein a thickness of the first layer is less than a thickness of the second layer.

17. The device of claim 10, wherein the second layer has an irregular shape.

18. The device of claim 10, wherein a direction of acoustic energy flow of the primary acoustic mode is substantially normal to the front and back surfaces of the one or more diaphragms.

19. The device of claim 10, wherein the plurality of acoustic resonators comprises at least one first acoustic resonator and at least one second acoustic resonator, wherein a front side dielectric layer is deposited over the at least one first acoustic resonator and not deposited over the at least one second acoustic resonator.

20. A method of fabricating an acoustic resonator device, comprising:
    bonding a piezoelectric plate to a substrate;
    forming a cavity in the substrate, before or after bonding the piezoelectric plate to the substrate, such that a portion of the piezoelectric plate forms a diaphragm spanning the cavity; and
    forming an interdigital transducer (IDT) on the front surface of the piezoelectric plate such that interleaved fingers of the IDT are disposed on the diaphragm, the IDT configured to excite a primary acoustic mode in the diaphragm in response to a radio frequency signal applied to the IDT,
    wherein the interleaved fingers comprise a first layer adjacent the diaphragm and a second layer over the first layer, the second layer having a narrower width than the first layer.

21. The method of claim 20, wherein the first layer is a different material than the second layer.

22. The method of claim 21, wherein the first layer comprises a low transverse acoustic impedance metal.

23. The method of claim 21, wherein the second layer comprises a high transverse acoustic impedance metal.

24. The method of claim 21, wherein the first layer comprises aluminum or titanium.

25. The method of claim 21, wherein the second layer comprises chromium or tungsten.

26. The method of claim 20, wherein a thickness of the first layer is less than a thickness of the second layer.

27. The method of claim 20, wherein the second layer has an irregular shape.

28. The method of claim 20, wherein a direction of acoustic energy flow of the primary acoustic mode is substantially normal to the front and back surfaces of the diaphragm.

* * * * *